US012701820B2

(12) United States Patent (10) Patent No.: US 12,701,820 B2
Ren et al. (45) Date of Patent: Aug. 4, 2026

(54) SOLAR CELL AND PHOTOVOLTAIC MODULE

(71) Applicant: LONGI PHOTOVOLTAIC TECHNOLOGY (ORDOS) CO., LTD., Ordos (CN)

(72) Inventors: Jungang Ren, Ordos (CN); Huijun Zhu, Ordos (CN); Pengfei Pan, Ordos (CN); Yulin Chen, Ordos (CN)

(73) Assignee: LONGI PHOTOVOLTAIC TECHNOLOGY (ORDOS) CO., LTD., Ordos (CN)

( * ) Notice: Subject to any disclaimer, the term of this patent is extended or adjusted under 35 U.S.C. 154(b) by 0 days.

(21) Appl. No.: 19/110,214

(22) PCT Filed: Feb. 6, 2025

(86) PCT No.: PCT/CN2025/076041
§ 371 (c)(1),
(2) Date: Mar. 10, 2025

(87) PCT Pub. No.: WO2025/171776
PCT Pub. Date: Aug. 21, 2025

(65) Prior Publication Data
US 2026/0107603 A1 Apr. 16, 2026

(30) Foreign Application Priority Data
Oct. 10, 2024 (CN) .......................... 202411404868.8

(51) Int. Cl.
*H10F 77/30* (2025.01)
*H10F 77/70* (2025.01)
(52) U.S. Cl.
CPC ......... *H10F 77/311* (2025.01); *H10F 77/703* (2025.01); *H10F 77/707* (2025.01)

(58) Field of Classification Search
CPC ..... H10F 77/311; H10F 77/707; H10F 77/703
See application file for complete search history.

(56) References Cited

U.S. PATENT DOCUMENTS

2013/0118571 A1* 5/2013 Shim ..................... H10F 77/703
257/E31.124
2015/0007887 A1* 1/2015 Shimizu ................ H10F 77/707
136/256
(Continued)

FOREIGN PATENT DOCUMENTS

AU 2024216424 A1 9/2024
CN 108428766 A 8/2018
(Continued)

OTHER PUBLICATIONS

International Search Report in International Appln. No. PCT/CN2025/076041, mailed on Jun. 20, 2025, 11 pages (with machine translation).
(Continued)

*Primary Examiner* — Sadie White
(74) *Attorney, Agent, or Firm* — Fish & Richardson P.C.

(57) ABSTRACT

This application discloses a solar cell and a photovoltaic module. In one example, a solar cell includes a first surface and a second surface opposite to each other, and a side surface connecting the first surface and the second surface. The side surface includes a cut surface, the cut surface including a cut edge adjacent to the first surface and a break edge adjacent to the second surface. A first passivation layer is formed on the cut surface. The first passivation layer includes an aluminum oxide passivation layer. The cut surface includes a first region adjacent to the cut edge and a second region farther away from the cut edge than the first region. A ratio of oxygen to aluminum in at least a part of
(Continued)

the first region is greater than a ratio of oxygen to aluminum in at least a part of the second region.

18 Claims, 2 Drawing Sheets

(56) References Cited

U.S. PATENT DOCUMENTS

| | | | |
|---|---|---|---|
| 2015/0136221 A1* | 5/2015 | Miyazaki | H10F 77/50 |
| | | | 136/256 |
| 2017/0179320 A1 | 6/2017 | Erben | |
| 2019/0259885 A1 | 8/2019 | Yoshikawa | |
| 2020/0052149 A1* | 2/2020 | Ito | H10F 10/14 |
| 2022/0059718 A1 | 2/2022 | Yuan et al. | |

FOREIGN PATENT DOCUMENTS

| | | |
|---|---|---|
| CN | 110034205 A | 7/2019 |
| CN | 110073500 A | 7/2019 |
| CN | 111834211 A | 10/2020 |
| CN | 111952414 A | 11/2020 |
| CN | 117153897 A | 12/2023 |
| CN | 117153898 A | 12/2023 |
| CN | 118116987 A | 5/2024 |
| CN | 118136701 A | 6/2024 |
| CN | 118156322 A | 6/2024 |
| CN | 118335841 A | 7/2024 |
| CN | 118398716 A | 7/2024 |
| CN | 118412390 A | 7/2024 |
| CN | 118738149 A | 10/2024 |
| CN | 118919578 A | 11/2024 |
| EP | 4701368 A1 | 2/2026 |
| JP | 2013219119 A | 10/2013 |
| JP | 2022-035906 A | 3/2022 |
| WO | 2013/146973 A1 | 10/2013 |

OTHER PUBLICATIONS

Munzer et al., "Post-Separation Processing for Silicon Heterojunction Half Solar Cells With Passivated Edges," IEEE Journal of Photovoltaics, Aug. 2021, 11(6):1343-1349.

Office Action in Australian Appln. No. 2025201709, mailed on Apr. 17, 2025, 12 pages.

Office Action in Japanese Appln. No. 2025-052805, mailed on May 7, 2025, 10 pages (with English translation).

Extended European Search Report in European Appln. No. 25708649. 6, mailed on Mar. 24, 2026, 13 pages.

* cited by examiner

SOLAR CELL AND PHOTOVOLTAIC MODULE

CROSS-REFERENCE TO RELATED APPLICATIONS

This application is a 371 national stage application of PCT Application No. PCT/CN2025/076041, filed on Feb. 6, 2025, which claims priority to Chinese Patent Application No. 202411404868.8, filed on Oct. 10, 2024. The disclosures of the aforementioned applications are hereby incorporated by reference in their entireties.

TECHNICAL FIELD

This application relates to the field of solar cell technologies, and in particular, to a solar cell and a photovoltaic module.

BACKGROUND

A solar cell is a device that uses solar energy and directly converts sunlight into electrical energy through a photoelectric effect or a photochemical effect. The solar cell includes sliced solar cells. Currently, the sliced solar cells are usually manufactured by using the following method: Cutting processing is performed on the solar cell on which a plurality of film layers have been formed, to cut the entire solar cell into at least two sliced solar cells, for example, two half-slices. Afterwards, the sliced solar cells are used to manufacture a photovoltaic module.

However, after the cutting, different regions of a cut surface of the sliced solar cell have a large difference in form, resulting in a reduction in efficiency of the solar cell.

SUMMARY

An objective of this application is to provide a solar cell and a photovoltaic module, to improve efficiency of the solar cell.

To implement the foregoing objective, according to a first aspect, this application provides a solar cell. The solar cell includes a first surface and a second surface opposite to each other, and a side surface connecting the first surface and the second surface. The side surface includes a cut surface, the cut surface including a cut edge adjacent to the first surface and a break edge adjacent to the second surface. A first passivation layer is formed on the cut surface. The first passivation layer includes an aluminum oxide passivation layer. The cut surface includes a first region adjacent to the cut edge and a second region farther away from the cut edge than the first region. A ratio of oxygen to aluminum in at least a part of the first region is greater than a ratio of oxygen to aluminum in at least a part of the second region.

The first region close to the cut edge is a region greatly affected by external direct impact, and has a relatively complex composition and surface form, for example, a form of silicon except monocrystalline silicon. The part of silicon includes a form of non-regularly arranged amorphous bodies, which has a large number of defects and dangling bonds. In addition, the complex surface form exacerbates formation of defects. Therefore, the part of silicon can be fully reacted based on existence of more oxygen, thereby eliminating a bad effect brought by the part of silicon. Compared with the first region, the second region is not subjected to the external direct impact or the external direct impact affecting the second region is relatively weak, and the second region basically includes a form of monocrystalline silicon with an integrated crystal structure. Introduction of excessive oxygen may cause more surface defects. Therefore, the ratio of oxygen to aluminum in the at least a part of the first region is set to be greater than the ratio of oxygen to aluminum in the at least a part of the second region, to balance impact brought by a difference between a surface form of the first region and a surface form of the second region, thereby improving overall efficiency of the solar cell.

In an implementation, the cut surface includes a plurality of first groove structures and a plurality of crack structures, where the plurality of first groove structures are located in the first region; and a thickness of the first passivation layer is greater than a depth of the plurality of first groove structures and less than a depth of the plurality of crack structures.

When the foregoing technical solution is used, the first passivation layer is formed on the cut surface. Therefore, the first passivation layer may perform passivation on the cut surface, to reduce a recombination rate of photo-generated carriers on the cut surface, thereby improving photoelectric conversion efficiency of the solar cell. Further, the plurality of first groove structures are densely distributed and have a complex structure, and sometimes also include a non-monocrystalline silicon composition of silicon, resulting in a complex surface form and composition of the region and high density of surface recombination centers.

Therefore, the thickness of the first passivation layer is set to be greater than the depth of the plurality of first groove structures. In this case, the first passivation layer can completely fill the plurality of first groove structures, to maximize passive repairing, thereby improving the conversion efficiency of the solar cell. Still further, most of the plurality of crack structures are formed by natural cracking under stress, and a surface of the plurality of crack structures is relatively smooth. Therefore, the thickness of the first passivation layer is set to be less than the depth of the plurality of crack structures, so that limited passivation can be completely performed on the region, and the first passivation layer formed on the cut surface is also in a fluctuating state. In this way, a light-trapping effect of the cut surface can be improved, and a concentration of the photo-generated carriers on the cut surface can be increased, to improve utilization on light by the cut surface of the solar cell, thereby improving the photoelectric conversion efficiency of the solar cell. In an implementation, the depth of the plurality of first groove structures is less than 1.2 μm. In this case, a damage degree of the first groove structure to the solar cell can be reduced, to ensure that breaking is not caused and excessive defects are not introduced during subsequent manufacturing.

In an implementation, the depth of the plurality of crack structures is greater than or equal to 1 μm. In this case, uniformity and a light-trapping effect of a coating during passivation can be ensured.

In an implementation, the thickness of the first passivation layer is greater than or equal to 30 nm and less than or equal to 200 nm. When the foregoing technical solution is used, a passivation effect of the solar cell gradually increases, and the conversion efficiency of the solar cell increases with the thickness of the first passivation layer.

In an implementation, a difference in the aluminum content between the at least apart of the second region and the at least a part of the first region is greater than 3%.

When the foregoing technical solution is used, it can be ensured that different passivation surfaces (namely, different regions) achieve a required passivation effect.

In an implementation, the plurality of first groove structures are adjacent to the cut edge, the plurality of first groove structures include end portions extending from the cut edge toward the break edge, and a boundary formed by the end portions of the plurality of first groove structures is wavy or zigzag.

When the foregoing technical solution is used, excessively concentrated stress on the cut surface of the solar cell can be avoided, thereby improving quality of the cut surface.

In an implementation, the cut surface includes an edge region and a middle region, where the edge region is adjacent to the cut edge or the break edge, and the middle region is located on a middle part of the cut surface; and a roughness of the first passivation layer located in the middle region is less than a roughness of the first passivation layer located in the edge region.

When the foregoing technical solution is used, escape of sunlight can be avoided as much as possible, and the passivation effect can be ensured.

In an implementation, a spacing between wavy or zigzag peaks is greater than or equal to 3 μm and less than or equal to 20 μm.

When the foregoing technical solution is used, the spacing between the peaks is greater than or equal to 3 μm. In this case, excessively concentrated distribution of the plurality of first groove structures can be avoided, to avoid excessively concentrated stress on the cut surface of the solar cell, thereby improving the quality of the cut surface.

In an implementation, an angle exists between an extending direction of the crack structure and an extending direction of the first groove structure, and the angle is greater than or equal to 45° and less than 90°.

In an implementation, in the cut surface, an extending length of the first groove structure is greater than or equal to 1 μm and less than or equal to 20 μm.

When the foregoing technical solution is used, damage caused by cracks to a silicon wafer can be reduced.

In an implementation, the first surface includes a plurality of second groove structures, where the plurality of second groove structures are adjacent to the cut edge.

In an implementation, in a direction away from the cut edge, an extending length of the plurality of second groove structures is greater than or equal to 20 μm and less than or equal to 100 μm.

In an implementation, the solar cell further includes: a second passivation layer formed in an edge region of the first surface, where the edge region of the first surface is close to the cut surface; and the second passivation layer and the first passivation layer are continuously distributed.

When the foregoing technical solution is used, the second passivation layer may perform passivation on the edge region of the first surface close to the cut surface, to reduce a recombination rate of carriers on the first surface, thereby improving the photoelectric conversion efficiency of the solar cell. Further, when the second passivation layer covers the plurality of second groove structures, the second passivation layer may perform passive repairing on the plurality of second groove structures, to improve the conversion efficiency of the solar cell.

In an implementation, in a direction from an edge of the first surface to a center region of the first surface, a width of the second passivation layer is greater than an extending length of the plurality of second groove structures.

In an implementation, in a direction from an edge of the first surface to a center region of the first surface, a width of the second passivation layer is greater than or equal to 0.05 mm and less than or equal to 2 mm.

In an implementation, the thickness of the first passivation layer is greater than a thickness of the second passivation layer.

In an implementation, in a direction from an edge of the first surface to a center region of the first surface, a thickness of the second passivation layer gradually decreases.

In an implementation, a thickness of the second passivation layer is greater than or equal to 30 nm and less than or equal to 200 nm.

In an implementation, the first surface is a light-receiving surface or a back surface.

According to a second aspect, this application further provides a photovoltaic module, including the solar cell according to the first aspect.

Compared with the conventional technologies, beneficial effects of the photovoltaic module provided in this application are the same as the beneficial effects of the solar cell in the foregoing technical solutions. Details are not described herein again.

BRIEF DESCRIPTION OF THE DRAWINGS

Accompanying drawings described herein are used for providing a further understanding of this application, and form part of this application. Exemplary embodiments of this application and descriptions thereof are used for explaining this application, and do not constitute any inappropriate limitation to this application. In the accompanying drawings.

REFERENCE NUMERALS

1—cut surface, 11—edge region, 12—middle region, 2—first groove structure, 3—crack structure, 4—first passivation layer, and 5—second passivation layer.

DETAILED DESCRIPTION

To make the technical problems to be resolved in this application, the technical solutions, and beneficial effects more comprehensible, the following further describes this application in detail with reference to the accompanying drawings and embodiments. It should be understood that, the specific embodiments described herein are merely used to explain this application but are not intended to limit this application.

It should be noted that, when an element is referred to as "being fixed to" or "being arranged on" another element, the element may be directly on the another element, or may be indirectly on the another element. When an element is referred to as "being connected to" another element, the element may be directly connected to the another element, or may be indirectly connected to the another element.

In addition, the terms "first" and "second" are used for descriptive objectives only and are not to be construed as indicating or implying relative importance or implicitly indicating the number of technical features indicated. Therefore, a feature defined by "first" or "second" may explicitly or implicitly include one or more features. In the description of this application, unless otherwise explicitly and specifically limited, "a plurality of" means two or more; and unless otherwise explicitly and specifically limited, "at least one" means one or more than one.

In the description of this application, it should be understood that, orientation or position relationships indicated by the terms such as "upper", "lower", "front", "rear", "left", and "right" are based on orientation or position relationships shown in the accompanying drawings, and are used only for ease and brevity of illustration and description of this application, rather than indicating or implying that the mentioned apparatus or element needs to have a particular orientation or needs to be constructed and operated in a particular orientation. Therefore, such terms should not be construed as limiting of this application.

In the description of this application, it should be noted that, unless otherwise explicitly specified or limited, the terms such as "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediate medium, internal communication between two elements, or an interaction relationship between two elements. A person of ordinary skill in the art may understand the specific meanings of the foregoing terms in this application according to specific situations.

Figure 1:
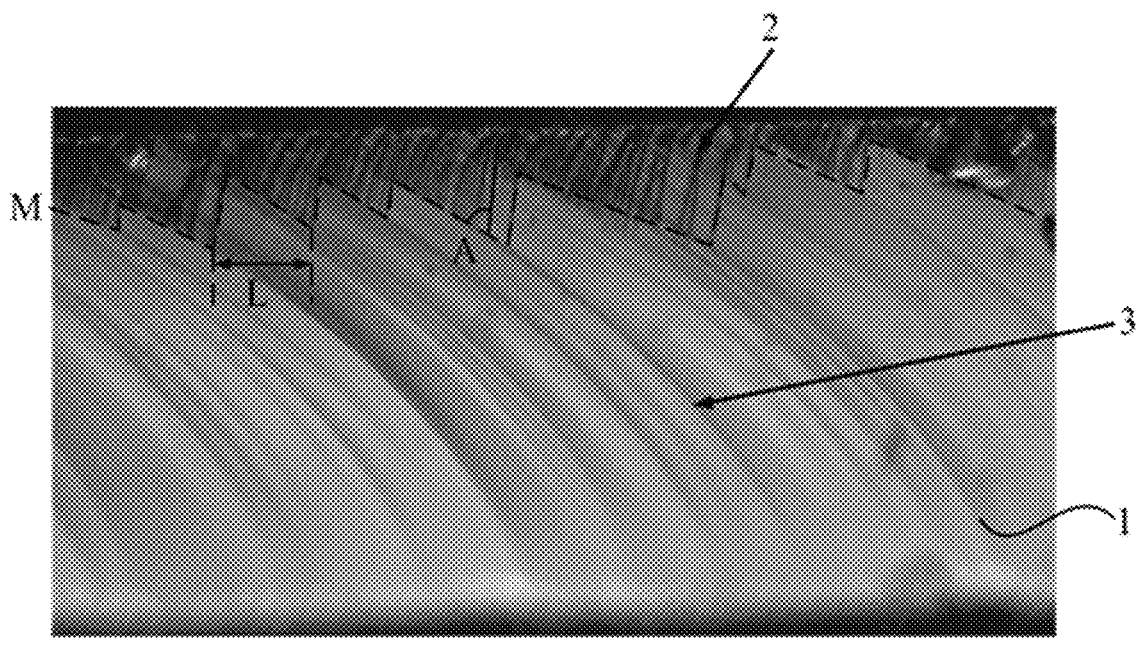
FIG. 1 is a SEM diagram of a cut surface according to an embodiment of this application.
Figure 2:
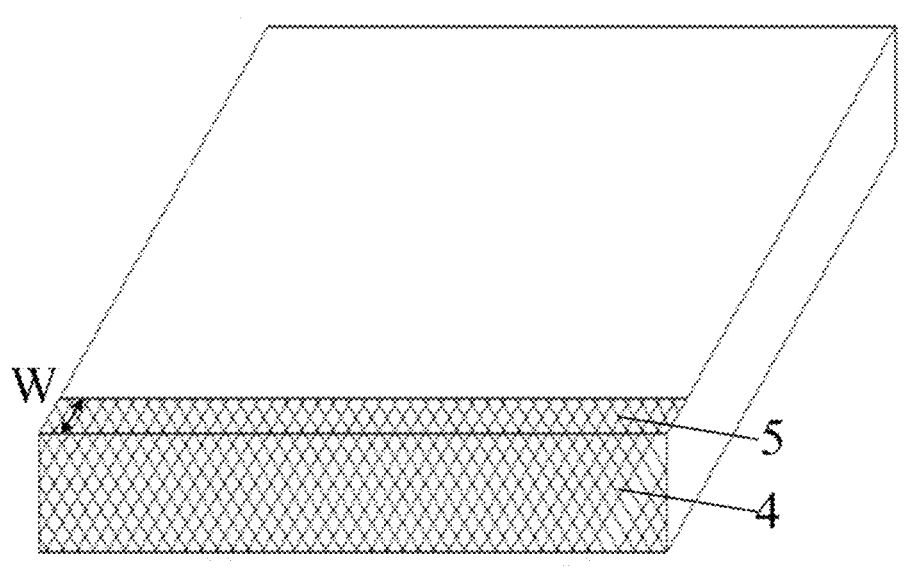
FIG. 2 is a schematic structural diagram of a solar cell in which a first passivation layer, a second passivation layer, and a third passivation layer are formed according to an embodiment of this application.

To resolve the foregoing technical problems, according to a first aspect, this application provides a solar cell. Referring to FIG. 1 and FIG. 2, the solar cell includes a first surface and a second surface opposite to each other, and a side surface connecting the first surface and the second surface. The side surface includes a cut surface 1, the cut surface 1 including a cut edge and a break edge opposite to each other. In a solar cell slicing process, the first surface of the solar cell is damaged to some extent by external direct impact, so that the solar cell can be broken or the solar cell is guided to be broken. For example, the first surface is damaged to some extent by performing mechanical cutting or laser irradiation on the first surface, and then, the entire solar cell is broken through a stress change, to form the complete cut surface 1. The cut edge is adjacent to the first surface of the solar cell subjected to the external direct impact in the cut surface 1, and the break edge is adjacent to the second surface.

A first passivation layer 4 is formed on the cut surface 1. The first passivation layer includes an aluminum oxide passivation layer. The cut surface includes a first region and a second region. The first region is adjacent to the cut edge, and the second region is farther away from the cut edge than the first region. A ratio of oxygen to aluminum in at least a part of the first region is greater than a ratio of oxygen to aluminum in at least a part of the second region.

The first region close to the cut edge is a region greatly affected by the external direct impact, and has a relatively complex composition and surface form, for example, a form of silicon except monocrystalline silicon. The part of silicon includes a form of non-regularly arranged amorphous bodies, which has a large number of defects and dangling bonds. In addition, the complex surface form exacerbates formation of defects. Therefore, the part of silicon can be fully reacted based on existence of more oxygen, thereby eliminating a bad effect brought by the part of silicon. Compared with the first region, the second region is not subjected to the external direct impact or the external direct impact affecting the second region is relatively weak, and the second region basically includes a form of monocrystalline silicon with an integrated crystal structure. Introduction of excessive oxygen may cause more surface defects. Therefore, the ratio of oxygen to aluminum in the at least a part of the first region is set to be greater than the ratio of oxygen to aluminum in the at least a part of the second region, to balance impact brought by a difference between a surface form of the first region and a surface form of the second region, thereby improving overall efficiency of the solar cell.

In a possible implementation, the first region is a region extending by 30 μm from the cut edge to the break edge, and the second region is a region except the first region. When the first region is the region extending by 30 μm from the cut edge to the break edge, a region subjected to the external direct impact is limited, entire stress on the cut surface of the solar cell is relatively balanced, and a risk of breaking in packaging of a photovoltaic module is reduced. The passivation manner is used, so that passive repairing can be effectively performed on cut and break locations, thereby ensuring a repairing effect.

The content of aluminum in the at least a part of the first region is less than the content of aluminum in the at least a part of the second region. For example, a difference in the aluminum content between the at least a part of the second region and the at least a part of the first region is greater than 3%. In this case, it can be ensured that different passivation surfaces (namely, different regions) achieve a required passivation effect.

In an optional manner, the content of aluminum in the at least a part of the first region is greater than or equal to 1% and less than or equal to 3%. For example, the content of aluminum in the at least a part of the first region may be 1%, 1.5%, 2%, 2.5%, 2.8%, or 3%. The content of aluminum in the at least a part of the second region is greater than or equal to 4% and less than or equal to 7%. For example, the content of aluminum in the at least a part of the second region may be 4%, 4.5%, 5%, 5.5%, 6%, 6.5%, or 7%.

TABLE 1

| Ratios of different elements located in the first region and the second region | | | | | | | |
|---|---|---|---|---|---|---|---|
| Thickness of the first passivation layer | Point location | Element ratio (Atom %) | | | | | |
| | | O | O | Al | Al | Si | Si |
| 30 nm to 50 nm | First region | 10.2 | 12.39 | 1.63 | 1.44 | 88.17 | 86.17 |
| | | 12.77 | | 1.58 | | 85.65 | |
| | | 14.19 | | 1.12 | | 84.69 | |
| | Second region | 9.79 | 10.38 | 3.38 | 4.35 | 86.82 | 85.27 |
| | | 11.01 | | 4.12 | | 84.87 | |
| | | 10.34 | | 5.54 | | 84.11 | |
| 50 nm to 80 nm | First region | 15.8 | 14.78 | 4.5 | 3.50 | 79.69 | 81.72 |
| | | 17.73 | | 3.23 | | 79.04 | |
| | | 10.81 | | 2.77 | | 86.43 | |
| | Second region | 13.92 | 17.18 | 6.01 | 6.45 | 80.06 | 76.37 |
| | | 19.26 | | 6.86 | | 73.87 | |
| | | 18.35 | | 6.48 | | 75.17 | |

It can be learned based on Table 1 that, the ratio of oxygen to aluminum in the first region is greater than 3, and the ratio of oxygen to aluminum in the second region is less than 3. For example, when a film thickness of the aluminum oxide passivation layer is less than 50 nim, the ratio of oxygen to aluminum in the first region is greater than or equal to 5, for example, 5, 6, 7, 8, or 9. When the film thickness of the aluminum oxide passivation layer is greater than 50 nim, the ratio of oxygen to aluminum in the first region is greater than or equal to 3 and less than or equal to 8, for example, 3, 4, 5, 6, 7, or 8.

The solar cell includes a semiconductor base. For example, the semiconductor base may be a silicon base. In terms of conductivity types, the solar cell may include an intrinsic conductive substrate, an N-type conductive substrate, or a P-type conductive substrate. Preferably, the semiconductor base is the N-type conductive substrate or the P-type conductive substrate. Compared with the intrinsic conductive substrate, the N-type conductive substrate or the P-type conductive substrate has higher conductivity, which helps to reduce series resistance of the solar cell, thereby improving the efficiency of the solar cell. In terms of structures, the first surface of the solar cell may be a textured surface, to improve a light-trapping effect of a light-receiving surface of the solar cell, thereby improving utilization on light by the solar cell. Certainly, the first surface of the solar cell may alternatively be a flat polished surface. The second surface of the solar cell may be a polished surface or a textured surface, which is not specifically limited herein.

According to another aspect of this application, the cut surface includes a plurality of first groove structures 2 and a plurality of crack structures 3, where the plurality of first groove structures 2 are located in the first region; and a thickness of the first passivation layer 4 is greater than a depth of the plurality of first groove structures 2 and less than a depth of the plurality of crack structures 3. For example, the crack structure roughly runs through the entire cut surface, and extends from the cut edge to the break edge.

Referring to FIG. 1 and FIG. 2, in the solar cell provided in this embodiment of this application, the first passivation layer 4 is formed on the cut surface. Therefore, the first passivation layer 4 may perform passivation on the cut surface 1, to reduce a recombination rate of photo-generated carriers on the cut surface, thereby improving photoelectric conversion efficiency of the solar cell. Further, the plurality of first groove structures are densely distributed and have a complex structure, and sometimes also include a non-monocrystalline silicon composition of silicon, resulting in a complex surface form and composition of the region and high density of surface recombination centers. Therefore, the thickness of the first passivation layer 4 is set to be greater than the depth of the plurality of first groove structures 2. In this case, the first passivation layer 4 can completely fill the plurality of first groove structures 2, to maximize passive repairing, thereby improving the conversion efficiency of the solar cell. Still further, most of the plurality of crack structures 3 are formed by natural cracking under stress, and a surface of the plurality of crack structures 3 is relatively smooth. Therefore, the thickness of the first passivation layer 4 is set to be less than the depth of the plurality of crack structures 3, so that limited passivation can be completely performed on the region, and the first passivation layer 4 formed on the cut surface 1 is also in a fluctuating state. In this way, a light-trapping effect of the cut surface 1 can be improved, and a concentration of the photo-generated carriers on the cut surface 1 can be increased, to improve utilization on light by the cut surface of the solar cell, thereby improving the photoelectric conversion efficiency of the solar cell. In addition, because the entire surface of the plurality of crack structures 3 is relatively smooth and regular, the plurality of crack structures 3 facilitate light absorption.

In a possible implementation, that the thickness of the first passivation layer is greater than the depth of the plurality of first groove structures and less than the depth of the plurality of crack structures may be understood as that an average thickness of the first passivation layer is greater than a maximum depth of the first groove structure and is less than a minimum depth of the crack structure; or the average thickness of the first passivation layer is greater than an average depth of the plurality of first groove structures and less than an average depth of the plurality of crack structures.

In a possible implementation, the thickness of the first passivation layer is greater than or equal to 30 nm and less than or equal to 200 nm. For example, the thickness of the first passivation layer may be 30 nm, 35 nm, 40 nm, 45 nm, 50 nm, 55 nm, 60 nm, 65 nm, 70 nm, 75 nm, 80 nm, 85 nm, 90 nm, 100 nm, 105 nm, 110 nm, 115 nm, 120 nm, 125 nm, 130 nm, 135 nm, 140 nm, 145 nm, 150 nm, 155 nm, 160 nm, 165 nm, 170 nm, 175 nm, 180 nm, 185 nm, 190 nm, 195 nm, or 200 nm. When the foregoing technical solution is used, a passivation effect of the solar cell gradually increases, and the conversion efficiency of the solar cell increases with the thickness of the first passivation layer. Further, an excessively small thickness of the passivation layer causes an insufficient passivation effect, and an excessively large thickness of the passivation layer reduces a marginal effect of a passivation effect, and increases process duration and material consumption.

The following describes parameters related to the solar cell by using the first passivation layer having different thicknesses as an example.

TABLE 2

| Parameters related to the solar cell | | | | |
| --- | --- | --- | --- | --- |
| | Eta | Isc | Voc | FF |
| 30 nm-BSL | 0.003 | 0.0006 | −0.0004 | 0.045 |
| 50 nm-BSL | 0.114 | 0.0031 | 0.0015 | 0.181 |
| 70 nm-BSL | 0.152 | 0.0052 | 0.002 | 0.22 |

BSL indicates a control group, and 30 nm-BSL indicates a difference between the first passivation layer with the thickness of 30 nm and the control group. Eta indicates conversion efficiency, Isc indicates a short-circuit current, Voc indicates an open-circuit voltage, and FF indicates a fill factor.

Figure 3:
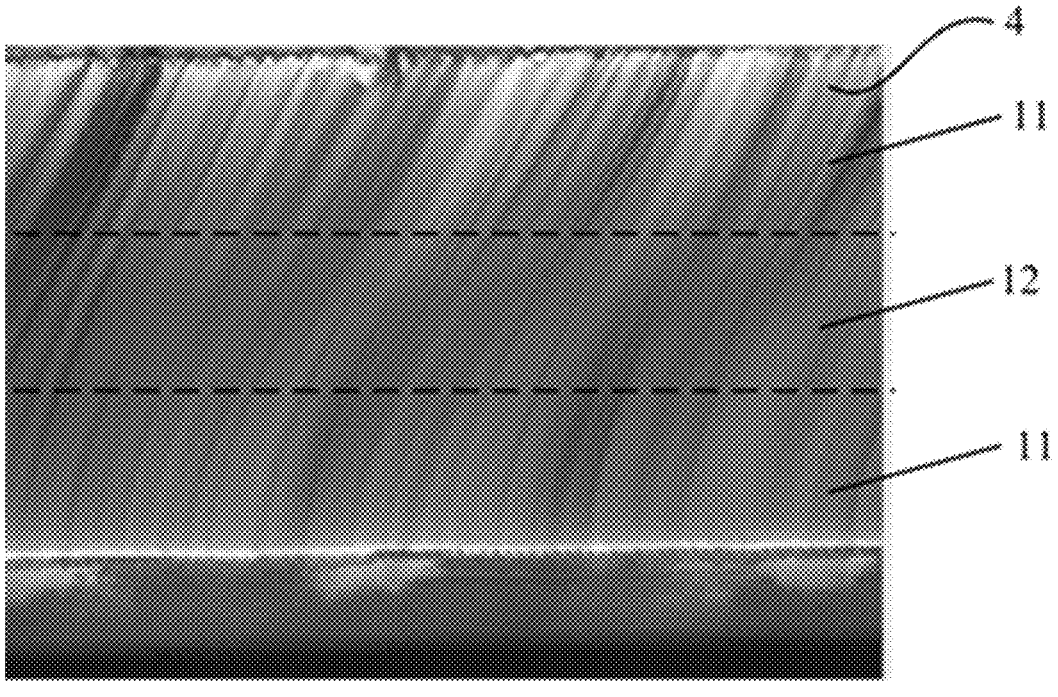
FIG. 3 is a SEM diagram obtained after a first passivation layer is formed on a cut surface according to an embodiment of this application.

In a possible implementation, referring to FIG. 1 and FIG. 3, the cut surface 1 includes an edge region 11 and a middle region 12, where the edge region 11 is adjacent to the cut edge or the break edge, and the middle region 12 is located on a middle part of the cut surface 1; and a roughness of the first passivation layer 4 located in the middle region 12 is less than a roughness of the first passivation layer 4 located in the edge region 11. In this case, escape of sunlight can be avoided as much as possible, and the passivation effect can be ensured.

In a possible implementation, in a direction away from the cut edge, in the cut surface, an extending length of the first groove structure is greater than or equal to 1 μm and less than or equal to 20 μm. In this case, an entire distribution region of the plurality of first groove structures is controlled, so that it can be ensured that the solar cell is cut effectively, and excessive defects are not introduced to the cut surface. For example, the extending length of the first groove structure may be 1 μm, 3 μm, 5 μm, 8 μm, 10 μm, 12 μm, 15 μm, 18 μm, or 20 μm.

In a possible implementation, the depth of the plurality of first groove structures is less than 1.2 μm. In this case, a damage degree of the first groove structure to the solar cell can be reduced, to ensure that breaking is not caused and excessive defects are not introduced during subsequent manufacturing.

In a possible implementation, referring to FIG. 1, the plurality of first groove structures 2 are distributed in the first region, the plurality of first groove structures 2 are adjacent to the cut edge, the plurality of first groove structures 2 extend from the cut edge to the break edge, the plurality of first groove structures 2 include end portions extending from the cut edge toward the break edge, and a boundary M formed by the end portions of the plurality of first groove structures 2 is wavy or zigzag.

In this case, excessively concentrated stress on the cut surface of the solar cell can be avoided, thereby improving quality of the cut surface. It should be noted that, the boundary of the end portion of the first groove structure is a boundary away from the cut edge.

In a possible implementation, the depth of the plurality of crack structures is greater than or equal to 1 μm, and a surface of the plurality of crack structures is smooth. In this case, uniformity and a light-trapping effect of a coating during passivation can be ensured.

In a possible implementation, a depth of a crack structure located in a region in which the plurality of first groove structures are located is greater than or equal to 1 μm and less than or equal to 2 μm. For example, the depth of the crack structure may be 1 μm, 1.2 μm, 1.5 μm, 1.7 μm, 1.9 μm, or 2 μm.

A depth of a crack structure away from the region in which the plurality of first groove structures are located is greater than or equal to 1 μm and less than or equal to 2 μm. For example, the depth of the crack structure may be 1 μm, 1.2 μm, 1.5 μm, 1.7 μm, 1.9 μm, or 2 μm.

In a possible implementation, referring to FIG. 1, the plurality of first groove structures 2 may be distributed in any one of a tree-like manner, a branch-like manner, and a curve-like manner. In this case, excessively concentrated stress on the cut surface of the solar cell can be avoided, thereby improving quality of the cut surface.

In an optional manner, referring to FIG. 1, a horizontal spacing L between wavy or zigzag peaks is greater than or equal to 3 μm and less than or equal to 20 μm. For example, the horizontal spacing L may be 3 μm, 5 μm, 8 μm, 10 μm, 12 μm, 13 μm, 15 μm, 18 μm, 19 μm, or 20 μm. The spacing between the peaks is greater than or equal to 3 μm. In this case, excessively concentrated distribution of the plurality of first groove structures can be avoided, to avoid excessively concentrated stress on the cut surface of the solar cell, thereby improving the quality of the cut surface.

In an optional manner, referring to FIG. 1, an angle A exists between an extending direction of the crack structure 3 and an extending direction of the first groove structure 2. Existence of the angle A can guide depth and width distribution of cracks to be more even. The angle A is preferably greater than or equal to 45° and less than 90°. For example, the angle A may be 45°, 50°, 55°, 60°, 65°, 70°, 75°, 80°, 85°, or 89°.

In a possible implementation, the first surface includes a plurality of second groove structures, where the plurality of second groove structures are adjacent to the cut edge.

In an optional manner, in a direction away from the cut edge, an extending length of the plurality of second groove structures is greater than or equal to 20 μm and less than or equal to 100 μm. For example, the length of the second groove structure may be 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, or 100 μm.

In an optional manner, referring to FIG. 2, the solar cell further includes: a second passivation layer 5 formed in an edge region of the first surface, where the edge region of the first surface is close to the cut surface; and the second passivation layer 5 and the first passivation layer 4 are continuously distributed.

When the foregoing technical solution is used, the second passivation layer may perform passivation on the edge region of the first surface close to the cut surface, to reduce a recombination rate of carriers on the first surface, thereby improving the photoelectric conversion efficiency of the solar cell. Further, when the second passivation layer covers the plurality of second groove structures, the second passivation layer may perform passive repairing on the plurality of second groove structures, to improve the conversion efficiency of the solar cell.

In a possible implementation, referring to FIG. 2, in a direction from an edge of the first surface to a center region of the first surface, a width W of the second passivation layer 5 is greater than an extending length of the plurality of second groove structures.

In a possible implementation, referring to FIG. 2, the width W of the second passivation layer 5 is greater than or equal to 0.05 mm and less than or equal to 2 mm. For example, the width W of the second passivation layer 5 may be 0.05 mm, 0.15 mm, 0.55 mm, 1 mm, 1.05 mm, 1.55 mm, or 2 mm. Preferably, the width W of the second passivation layer 5 is greater than or equal to 1 mm and less than or equal to 2 mm. For example, the width of the second passivation layer may be 1 mm, 1.05 mm, 1.35 mm, 1.55 mm, 1.85 mm, or 2 mm.

In an optional manner, the thickness of the first passivation layer is greater than a thickness of the second passivation layer.

In an optional manner, in a direction from an edge of the first surface to a center region of the first surface, a thickness of the second passivation layer gradually decreases.

In an optional manner, in a direction from an edge of the first surface to a center region of the first surface, a thickness of the second passivation layer is greater than or equal to 30 nm and less than or equal to 200 nm. For example, the thickness of the second passivation layer may be 30 nm, 35 nm, 40 nm, 45 nm, 50 nm, 55 nm, 60 nm, 65 nm, 70 nm, 75 nm, 80 nm, 85 nm, 90 nm, 100 nm, 105 nm, 110 nm, 115 nm, 120 nm, 125 nm, 130 nm, 135 nm, 140 nm, 145 nm, 150 nm, 155 nm, 160 nm, 165 nm, 170 nm, 175 nm, 180 nm, 185 nm, 190 nm, 195 nm, or 200 nm.

In a possible implementation, the solar cell further includes: a third passivation layer formed in an edge region of the second surface, where the edge region of the second surface is close to the cut surface; and the third passivation layer and the first passivation layer are continuously distributed.

When the foregoing technical solution is used, the third passivation layer may perform passivation on the edge region of the second surface close to the cut surface, to reduce a recombination rate of carriers on the second surface, thereby improving the photoelectric conversion efficiency of the solar cell.

In a possible implementation, in addition to the first passivation layer, the second passivation layer, and the third passivation layer, another passivation layer, for example, at least one of silicon oxide, silicon nitride, and silicon oxynitride, laminated on or below the first passivation layer, the second passivation layer, or the third passivation layer may be further included.

In an optional manner, in a direction from an edge of the second surface to a center region of the second surface, a width of the third passivation layer is greater than or equal to 20 μm and less than or equal to 100 μm. For example, the width of the third passivation layer may be 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, or 100 μm.

In an optional manner, the thickness of the first passivation layer is greater than a thickness of the third passivation layer.

In an optional manner, in a direction from an edge of the second surface to a center region of the second surface, a thickness of the third passivation layer gradually decreases.

In an optional manner, in a direction from an edge of the second surface to a center region of the second surface, a thickness of the third passivation layer is greater than or equal to 30 nm and less than or equal to 200 nm. For example, the thickness of the third passivation layer may be 30 nm, 35 nm, 40 nm, 45 nm, 50 nm, 55 nm, 60 nm, 65 nm, 70 nm, 75 nm, 80 nm, 85 nm, 90 nm, 100 nm, 105 nm, 110 nm, 115 nm, 120 nm, 125 nm, 130 nm, 135 nm, 140 nm, 145 nm, 150 nm, 155 nm, 160 nm, 165 nm, 170 nm, 175 nm, 180 nm, 185 nm, 190 nm, 195 nm, or 200 nm.

In an optional manner, the first surface is a light-receiving surface or a back surface. The solar cell may be a double-sided solar cell or a back contact solar cell. The solar cell may be a PERC solar cell, a TOPCON solar cell, a TBC solar cell, or a heterojunction solar cell. Certainly, the solar cell may alternatively be a solar cell including a tunneling passivation structure or another type of solar cell including a heterojunction structure.

According to a second aspect, an embodiment of this application further provides a photovoltaic module, including the solar cell according to the first aspect.

The photovoltaic module includes a solar cell string formed by interconnecting a plurality of solar cells. The solar cell string includes a welding interconnecting structure, for example, a welding strip or a welding wire. The welding interconnecting structure electrically connects two adjacent solar cells. The welding interconnecting structure has a head and a tail. At least one of the head and the tail of the welding interconnecting structure is adjacent to a cut surface of a solar cell. For example, the two adjacent solar cells are a first solar cell and a second solar cell. The welding interconnecting structure electrically connects the first solar cell and the second solar cell adjacent to each other. The welding interconnecting structure extends from a location near a cut surface of the first solar cell to a location near a cut surface of the second solar cell, or the welding interconnecting structure extends from the location near the cut surface of the first solar cell to a location near a side surface of the second solar cell relative to the cut surface of the second solar cell, or the welding interconnecting structure extends from a location near a side surface of the first solar cell relative to the cut surface of the first solar cell to the location near the cut surface of the second solar cell. Because it is relatively difficult to control locations and offsets of the head and the tail of the welding interconnecting structure in a welding process, there is a probability of damaging a passivation medium layer or even breaking the passivation medium layer. A first passivation layer is formed on a cut surface of the solar cell in this application; and additionally, a second passivation layer is formed on edge regions of the first surface and the second surface adjacent to the cut surface, and a third passivation layer is formed on an edge region of the second surface adjacent to the cut surface, so that the edge regions of the first surface and the second surface each have a relatively thick medium layer, and sufficient protection can be formed for the edge regions of the solar cell, thereby reducing a probability that the head and the tail of the welding interconnecting structure break the passivation medium layer. Further, at least one of the head and the tail of the welding interconnecting structure extends into above the second passivation layer in the edge region of the first surface or the third passivation layer in the edge region of the second surface.

Beneficial effects of the photovoltaic module provided in this embodiment of this application are the same as the beneficial effects of the solar cell in the foregoing technical solutions. Details are not described herein again.

In the descriptions of the foregoing implementations, the described specific features, structures, materials, or characteristics may be combined in a proper manner in any one or more of the embodiments or examples.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A solar cell, comprising:
   a first surface and a second surface opposite to each other, wherein the first surface is a light receiving surface or a back surface of the solar cell; and
   a side surface connecting the first surface and the second surface, wherein the side surface comprises a cut surface, the cut surface comprising a cut edge adjacent to the first surface and a break edge adjacent to the second surface, and wherein the cut surface comprises a plurality of first groove structures; and
   a first passivation layer formed on the cut surface, wherein the first passivation layer comprises aluminum oxide,
   wherein the cut surface comprises a first region adjacent to the cut edge and a second region farther away from the cut edge than the first region, wherein a ratio of oxygen to aluminum in at least a part of the first region is greater than a ratio of oxygen to aluminum in at least a part of the second region.

2. The solar cell according to claim 1, wherein the cut surface comprises a plurality of crack structures, wherein the plurality of first groove structures are located in the first region,
   wherein a thickness of the first passivation layer is greater than a depth of the plurality of first groove structures and less than a depth of the plurality of crack structures.

3. The solar cell according to claim 2, wherein:
   the depth of the plurality of first groove structures is less than 1.2 μm; or
   the depth of the plurality of crack structures is greater than or equal to 1 μm.

4. The solar cell according to claim 1, wherein a thickness of the first passivation layer is greater than or equal to 30 nm and less than or equal to 200 nm.

5. The solar cell according to claim 1, wherein a difference in aluminum content between the at least a part of the second region and the at least a part of the first region is greater than 3%.

6. The solar cell according to claim 2, wherein the plurality of first groove structures are adjacent to the cut edge, the plurality of first groove structures comprise end portions extending from the cut edge towards the break edge, and wherein a boundary formed by the end portions of the plurality of first groove structures has a wavy shape or a zigzag shape.

7. The solar cell according to claim 1, wherein the cut surface comprises an edge region and a middle region, wherein the edge region is adjacent to the cut edge or the break edge, and the middle region is located on a middle part of the cut surface, and wherein a roughness of the first passivation layer in the middle region is less than a roughness of the first passivation layer in the edge region.

8. The solar cell according to claim 6, wherein a spacing between peaks of the wavy shape or the zigzag shape is greater than or equal to 3 μm and less than or equal to 20 μm.

9. The solar cell according to claim 6, wherein an angle between an extending direction of a crack structure and an extending direction of a first groove structure is greater than or equal to 45° and less than 90°.

10. The solar cell according to claim 6, wherein in the cut surface, an extending length of a groove structure of the plurality of first groove structures is greater than or equal to 1 μm and less than or equal to 20 μm.

11. The solar cell according to claim 1, wherein the first surface comprises a plurality of second groove structures adjacent to the cut edge.

12. The solar cell according to claim 11, wherein in a direction away from the cut edge, an extending length of a groove structure of the plurality of second groove structures is greater than or equal to 20 μm and less than or equal to 100 μm.

13. The solar cell according to claim 11, further comprising: a second passivation layer formed in an edge region of the first surface, wherein the edge region of the first surface is close to the cut surface, and wherein the second passivation layer and the first passivation layer are continuously distributed.

14. The solar cell according to claim 13, wherein in a direction from an edge of the first surface to a center region of the first surface, a width of the second passivation layer is greater than an extending length of a groove structure of the plurality of second groove structures.

15. The solar cell according to claim 13, wherein in a direction from an edge of the first surface to a center region of the first surface, a width of the second passivation layer is greater than or equal to 0.05 mm and less than or equal to 2 mm.

16. The solar cell according to claim 13, wherein a thickness of the first passivation layer is greater than a thickness of the second passivation layer.

17. The solar cell according to claim 13, wherein in a direction from an edge of the first surface to a center region of the first surface, a thickness of the second passivation layer gradually decreases.

18. The solar cell according to claim 13, wherein a thickness of the second passivation layer is greater than or equal to 30 nm and less than or equal to 200 nm.

* * * * *